United States Patent
Mohanty et al.

(10) Patent No.: US 9,520,270 B2
(45) Date of Patent: Dec. 13, 2016

(54) DIRECT CURRENT SUPERPOSITION CURING FOR RESIST REFLOW TEMPERATURE ENHANCEMENT

(71) Applicant: Tokyo Electron Limited, Minato-ku, Tokyo (JP)

(72) Inventors: Nihar Mohanty, Clifton Park, NY (US); Akiteru Ko, Schenectady, NY (US); Chi-Chun Liu, Guilderland, NY (US)

(73) Assignee: Tokyo Eelctron Limited, Tokyo (JP)

( * ) Notice: Subject to any disclaimer, the term of this patent is extended or adjusted under 35 U.S.C. 154(b) by 0 days.

(21) Appl. No.: 14/340,721

(22) Filed: Jul. 25, 2014

(65) Prior Publication Data
US 2016/0023238 A1    Jan. 28, 2016

(51) Int. Cl.
*H01J 37/32* (2006.01)
*G03F 7/40* (2006.01)
*H01L 21/3105* (2006.01)
*H01L 21/027* (2006.01)
*H01L 21/308* (2006.01)
*H01L 21/3065* (2006.01)
*B81C 1/00* (2006.01)

(52) U.S. Cl.
CPC ........ *H01J 37/32091* (2013.01); *G03F 7/40* (2013.01); *H01L 21/0273* (2013.01); *H01L 21/3065* (2013.01); *H01L 21/3086* (2013.01); *H01L 21/31058* (2013.01); *B81C 1/00428* (2013.01); *B81C 2201/0149* (2013.01)

(58) Field of Classification Search
CPC ........ H01J 37/32091; H01L 21/3086; H01L 21/3065; H01L 21/31058; H01L 21/0273; G03F 7/40; B81C 2201/0149; B81C 1/00428
See application file for complete search history.

(56) References Cited

U.S. PATENT DOCUMENTS

| | | | |
|---|---|---|---|
| 6,503,693 B1 * | 1/2003 | Mohondro | G03F 7/405 216/49 |
| 7,670,760 B2 * | 3/2010 | Shen | G03F 7/168 430/330 |
| 7,767,099 B2 * | 8/2010 | Li | H01L 21/0337 216/17 |
| 8,398,868 B2 * | 3/2013 | Cheng | B81C 1/00031 216/18 |
| 8,420,547 B2 * | 4/2013 | Ooya | H01J 37/32027 216/12 |

(Continued)

*Primary Examiner* — Anita Alanko

(57) ABSTRACT

Techniques herein include methods for curing a layer of material (such as a resist) on a substrate to enable relatively greater heat reflow resistance. Increasing reflow resistance enables successful directed self-assembly of block copolymers. Techniques include receiving a substrate having a patterned photoresist layer and positioning this substrate in a processing chamber of a capacitively coupled plasma system. The patterned photoresist layer is treated with a flux of electrons by coupling negative polarity direct current power to a top electrode of the plasma processing system during plasma processing. The flux of electrons is accelerated from the top electrode with sufficient energy to pass through a plasma and its sheath, and strike the substrate such that the patterned photoresist layer changes in physical properties, which can include an increased glass-liquid transition temperature.

12 Claims, 4 Drawing Sheets

(56) References Cited

U.S. PATENT DOCUMENTS

| | | | |
|---|---|---|---|
| 2010/0081285 A1* | 4/2010 | Chen | G03F 7/40 |
| | | | 438/710 |
| 2011/0059616 A1* | 3/2011 | Narishige | H01L 21/0273 |
| | | | 438/711 |
| 2011/0070665 A1* | 3/2011 | Chen | H01J 37/32027 |
| | | | 438/5 |

* cited by examiner

DIRECT CURRENT SUPERPOSITION CURING FOR RESIST REFLOW TEMPERATURE ENHANCEMENT

BACKGROUND OF THE INVENTION

This invention relates to semiconductor processing, and, in particular, to methods and apparatus for curing a layer of a processable material on a substrate.

Curing of processable materials is a common practice in photolithography. In material processing methodologies (such as photolithography), creating patterned layers involves the application of a thin layer of radiation-sensitive material, such as photoresist, to an upper surface of a substrate. This radiation-sensitive material is transformed into a patterned mask that can be used to etch or transfer a pattern into an underlying layer on a substrate. Patterning of the radiation-sensitive material generally involves exposure by a radiation source through a reticle (and associated optics) onto the radiation-sensitive material using, for example, a photolithography system. This exposure can then be followed by the removal of irradiated regions of the radiation-sensitive material (as in the case of positive photoresist), or non-irradiated regions (as in the case of negative resist) using a developing solvent.

Using resist coatings typically includes baking. The baking (curing) of organic films is critical to the manufacturing process used for integrated circuits. This process is typically referred to as a "post apply bake" or PAB. Typical films include top coat barrier layers (TC), top coat antireflective layers (TARO), bottom antireflective layers (BARO), imaging layers (PR or photoresist), and sacrificial and barrier layers (hard mask) for etch stopping. Curing of films also typically includes a post exposure bake (PEB). The bake process time and temperature are used to drive out solvents and cure or harden the film and thereby define the characteristics of the film at exposure and post exposure develop where circuit features are defined, prior to etching the features into the substrate. Thermal processing of such films enables subsequent use and processing of the patterned photoresist.

SUMMARY

Using photolithography to pattern resist layers has scaling limitations. As the critical dimensions of the patterned layout approach the resolution limit of the lithography equipment, optical proximity effects (OPE) begin to influence the manner in which features on a mask transfer to the layer of radiation-sensitive material such that the mask and actual layout patterns begin to differ. In other words, photolithography by itself cannot make patterns as small as desired or specified. One technique to enable patterning of smaller features is known as directed self-assembly (DSA).

DSA involves using block copolymers (BCPs) to define smaller patterns within a photolithographic patterned layer. Typically a BCP composed of two strands of chemically distinct polymers, such as PMMA and PS, covalently bonded together is spun onto a substrate. Self-assembly is then activated by heating the block copolymers. Such heating initiates the self-assembly process in which the randomly oriented BCPs rearrange themselves so that the like polymer strands can form a micro domain where possible. This phase-separation and assembly is guided by topographical or chemical guiding patterning and can then result in different structures, such as lines and cylinders. Such a technique can reduce the size or multiply the photolithographically-defined pattern.

One challenge with using DSA to shrink resist patterns, however, is that patterned resist layers cannot survive the polymer heating or curing process. For example, a resist layer can be patterned to define an array of holes or trenches. The block copolymer can then be spun-on to fill the holes or trenches. The block copolymer is then heated to initiate phase separation. The temperature required to initiate phase separation, however, is greater than a glass-liquid transition temperature (reflow temperature) of the resist layer. As the reflow temperature is reached, the resist loses its physical shape as the resist begins to flow again, thereby filling holes/trenches and mixing with the block copolymer.

Techniques herein include methods for curing a layer of material (such as a resist) on a substrate to enable relatively greater heat reflow resistance to enable successful directed self-assembly. One embodiment includes a method of curing a layer of material on a substrate. The method includes receiving a substrate having a patterned photoresist layer. The substrate is positioned in a processing chamber of a capacitively coupled plasma system. The patterned photoresist layer is treated with a flux of electrons by coupling negative polarity direct current power to a top electrode of the plasma processing system. The flux of electrons is accelerated from the top electrode with sufficient energy to pass through a plasma and its sheath, and strike the substrate such that the patterned photoresist layer is changed in physical properties. Physical properties can include an increase in reflow temperature. A block copolymer film can then be dispensed on the patterned photo resist layer that now has a comparatively higher reflow temperature.

Such techniques enable, for example, use of negative tone developer resists to be used for DSA patterning.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques herein include methods for curing a layer of material (such as a resist) on a substrate to enable relatively greater heat reflow resistance to enable successful directed self-assembly. One embodiment includes a method of curing a layer of material on a substrate. Such materials can include positive tone resists and even negative tone resists.

Negative Tone Developer (NTD) photo resists (PR) have become the photoresist of choice for particular applications using directed self-assembly (DSA) of block copolymers (BCP). Specifically, NTD can be used to create a template for BCP DSA via a graphoepitaxy approach. One challenge with using NTD resists is curing prior to application of the BCP. A temperature often specified for BCP curing is around 210° C. This is a problem because typical NTD resist reflows at around 190° C. Thus, it is currently not possible to cure the BCP without reflowing the NTD. Reflowing destroys the pattern or guides defined by the photo resist, which means there are no structures to guide self-assembly.

Techniques herein include executing a Direct Current Superposition (DCS) treatment of a photo resist such that a reflow temperature of the reflow resist increases to a value above a curing temperature of a given block copolymer. In one example, executing DCS treatment on an NTD results in reflow temperature of over 2225° C. or greater. In some treatments, reflow temperature of the resist can exceed 250° C. In other words, using DCS increases a glass-liquid transition temperature of the NTD resist from around 190° C. to around 250° C. or more. Such techniques thus enable DSA applications such as block copolymer via/hole shrink on an entity resist. Such techniques also enable graphoepitaxy on NTD resists to facilitate BCP annealing at its corresponding activation temperature. Such a discovery is significant. Negative tone resist is often selected for use over positive tone resist because the glass-liquid transition temperature (Tg) of negative tone resist is higher. For critical hole applications, using negative tone develop resist is preferred, in part, from an integration point of view. The Tg of negative tone resist, however, is significantly lower than that typically recommended for BCP anneal, and has made directed self-assembly challenging or impossible.

Figure 1:
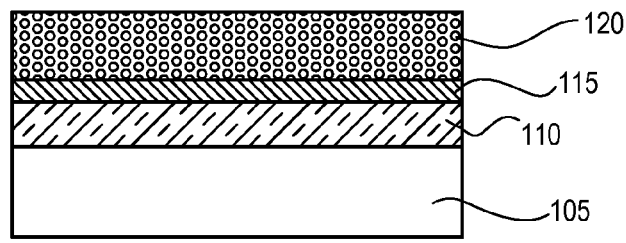
FIGS. 1, 2, 3, 4, 5A, 5B, 6, 7 and 8 are cross-sectional views showing progression of an example patterning method according to embodiments herein.
Figure 2:
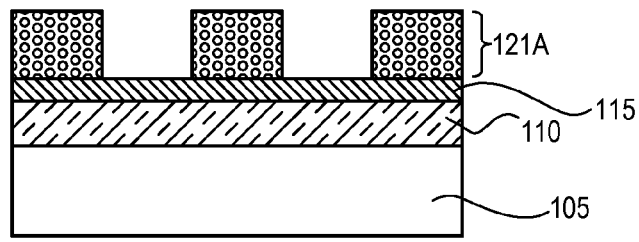

Referring now to FIGS. 1-8, an example patterning scheme, according to embodiments herein, will be described. FIG. 1 shows a cross-sectional side view of an example substrate to be patterned. This includes substrate 105, silicon layer 110, mask layer 115, and resist 120. Note that any number of materials/layers can be selected for layers underlying the resist layer 120. For convenience in describing embodiments herein, a few of the underlying layers have been named. Other layers conventionally used with photolithography can also be used, such as anti-reflective coatings. Resist layer 120 can be coated on the substrate by spinning on liquid resist in a coater-developer tool as conventionally used in semiconductor fabrication. After coating the substrate with resist layer 120 and after a post application bake (PAB), the substrate is ready for photolithographic exposure. The substrate is then exposed to a pattern of light or radiation using a reticle or photomask and an exposure tool. Exposure to a pattern of radiation causes a chemical change that creates a latent pattern in the photoresist.

The latent pattern in the photoresist is then chemically developed to reveal a photoresist pattern 121A, which defines a topography. The topography can include trenches, holes, vias, etc. Methods herein include receiving a substrate having a patterned photoresist layer 121A, which photoresist layer defines a topography as compared to a latent patterned layer.

Figure 11:
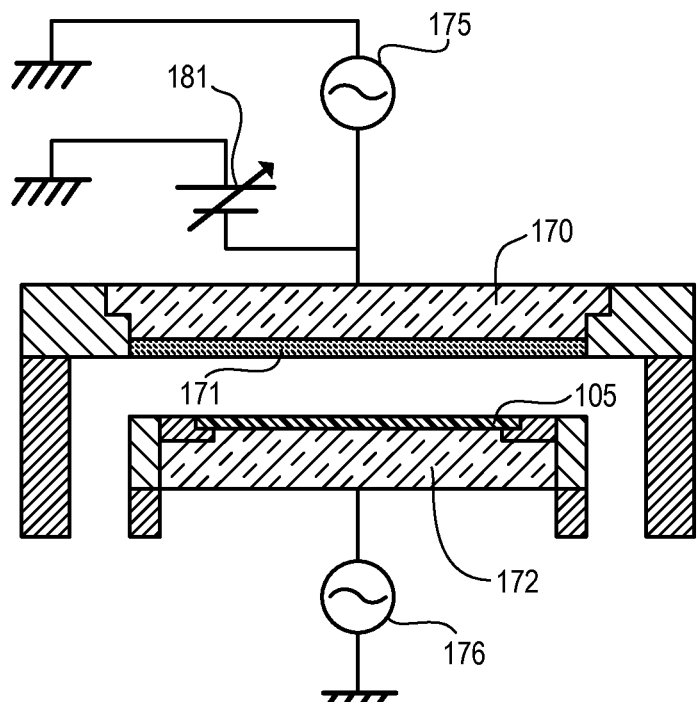
FIGS. 11 and 12 are schematic diagrams of a plasma processing systems used with embodiments herein.
Figure 12:
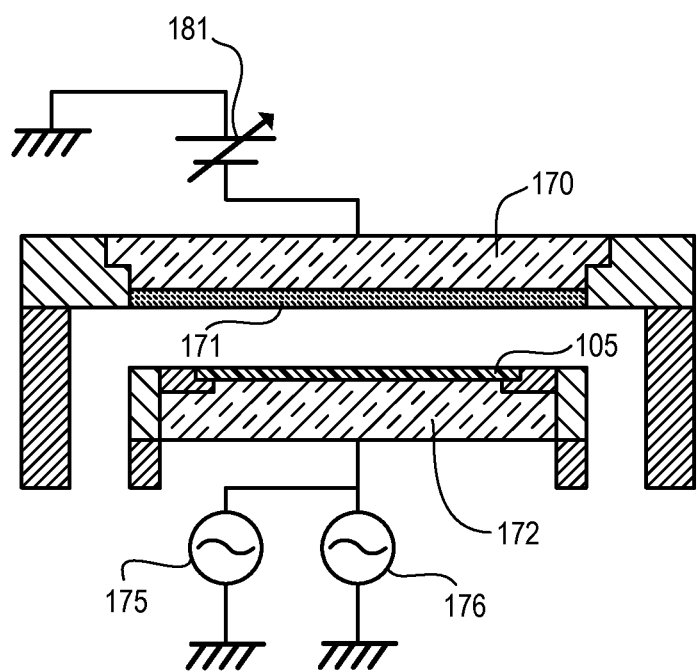

The substrate is then positioned in a processing chamber of a capacitively coupled plasma system. FIGS. 11 and 12 illustrate an example capacitively coupled plasma system, which will be described in more detail below. Using this plasma processing system, the patterned photoresist layer 121A is treated with a flux of electrons. This flux of electrons is created by coupling negative polarity direct current power to a top electrode of the plasma processing system in the presence of plasma. This flux of electrons is accelerated from the top electrode with sufficient energy to pass through the plasma and strike the substrate (patterned photoresist layer 121A) such that the patterned photoresist layer 121A changes in physical properties.

Figure 3:
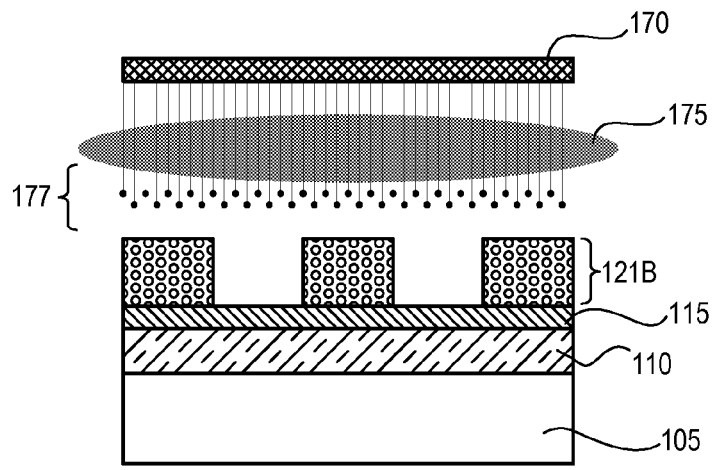

FIG. 3 depicts the electron flux 177 showing electrons and particles traveling from upper electrode plate 170, through plasma 175 and eventually striking the patterned photoresist layer. With changed physical properties, patterned photoresist layer 121B can now enable subsequent processing including directed self-assembly operations. The plasma can be created from various process gases and/or mixtures of gasses flowed into the processing chamber. Process gases can comprise hydrogen gas and an inert gas. In other embodiments, the process gas comprises nitrogen gas and an inert gas such as argon. Process gas selection can be based on type of photoresist material being treated.

The change in physical properties of the patterned photoresist layer can include increasing in a reflow temperature as compared to prior to being treated with the flux of electrons. Thus, patterned photoresist layer 121B has a higher reflow temperature than patterned photoresist layer 121A. This change can also be considered as increasing in a glass-liquid transition temperature as compared to a state prior to being treated with the flux of electrons. In some embodiments, the glass-liquid transition temperature is increased above 210 degrees Celsius. In other embodiments, the glass-liquid transition temperature is increased above 250 degrees Celsius or more.

Figure 4:
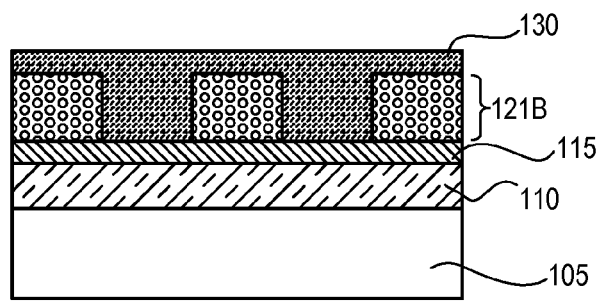

With patterned photoresist layer 121B now resistant to reflowing at DSA processing temperatures, subsequent patterning operations can continue successfully. A block copolymer film 130 can be dispensed (typically in liquid form) on the patterned photoresist layer. This film can fill in trenches and holes defined by the patterned photoresist as shown in FIG. 4. In one example, block copolymer comprises polystyrene and Poly Methyl Methacrylate (PS-PMMA).

Figures 5A, 5B:
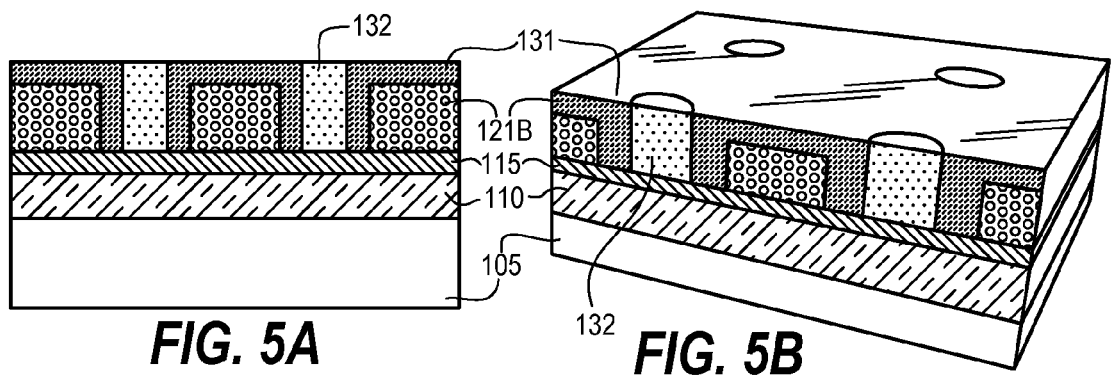

With block copolymer applied, activation of phase separation can be executed. Typically the substrate is heated to a predetermined activation temperature. By way of a non-limiting example, some block polymers need to be heated to approximately 210-220° C. At this temperature, each polymerized monomer can micro phase separate to form alternating nano structures (usually lines or cylinders). FIG. 5A shows that within the trench or hole the PMMA 132 formed a structure located in the center of the trench or hole, while the PS 131 formed a structure surrounding the PMMA 132. FIG. 5B shows a cross-section perspective view of an example application of filling holes. Note that the PMMA 132 has a diameter about half that of the hole. In this way, a hole (or trench) pattern can be doubled. Note that DSA can be used to form multiple alternating nano-scale structures within a hole or trench.

Figure 6:
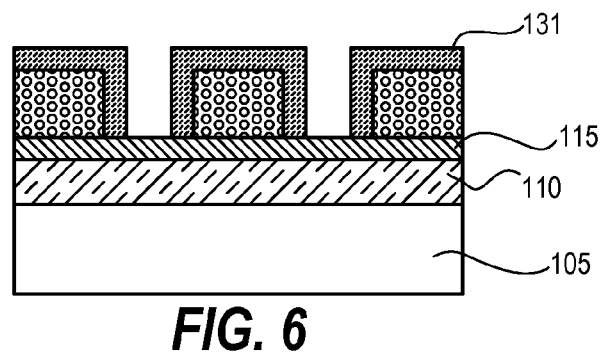
Figure 7:
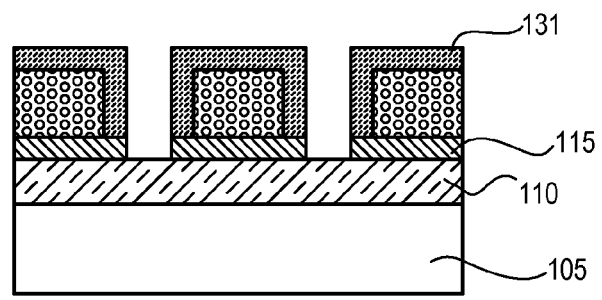
Figure 8:
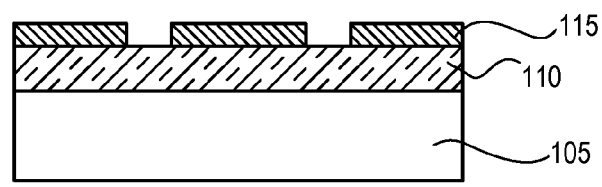

With two different polymers micro separated, a selective etching (wet or dry) operation can remove one of the polymers. FIG. 6 shows PMMA 132 structure having been removed. With the hole or trench effectively shrunk or reduced in size, another etching operation can transfer this doubled pattern (or reduced critical dimension pattern) into an underlying structure, such as mask layer 115, as shown in FIG. 7. The resist can polymer layers can then be washed away, leaving a patterned mask layer 115 as shown in FIG. 8. With the patterned mask layer in place—having a desired critical dimension—one or more underlying layers can be etched.

Figure 9A:
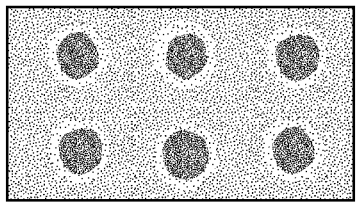
FIGS. 9A, 9B and 9C illustrate a top view rendering of resist reflow progression into defined holes.
Figure 9B:
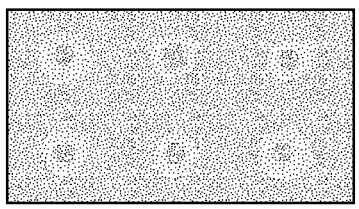
Figure 9C:
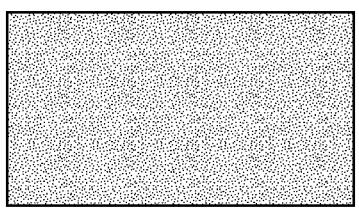
Figure 10C:
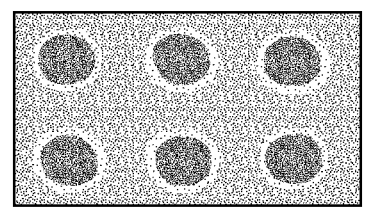

FIGS. 9A, 9B, and 9C depict a non-treated patterned resist layer at about 190° C. Note that as heating time increases, the defined holes in FIG. 9A begin to collapse. FIG. 9B shows partially filled-in holes, and then FIG. 9C illustrates filled in holes. With holes filled in, successful directed self-assembly cannot be carried out because there is no graphical topography to contain or direct the self-assembly of block copolymers.

Figure 10A:
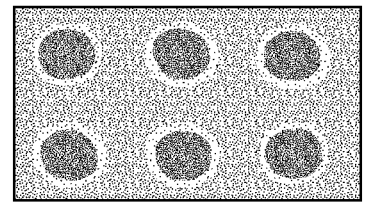
FIGS. 10A, 10B and 10C illustrate a top view rending of e-beam treated resist and its resistance to heating-based reflow.
Figure 10B:
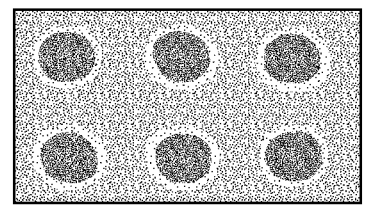

FIGS. 10A, 10B, and 100, however, depict an example patterned resist that has been treated with direct current superposition in a plasma chamber. The progression of the figures shows that there is no reflow even after having been heated to about 250° C. Thus, increasing a glass-liquid transition temperature of the resist enables using the resist for withstanding additional heat processing. This is beneficial for using DSA to shrink holes or lines, but graphoepitaxy is predominantly used for holes. Thus techniques herein enable DSA double patterning or shrinking of hole critical dimensions.

The direct current superposition treatment can be executed within a capacitively-coupled plasma (CCP) processing system, which typically forms plasma between two opposing, parallel plates (an upper electrode and a lower electrode). Typically a substrate rests on the lower electrode or a substrate holder positioned just above the lower electrode. Applying negative DC to an upper electrode then draws positively charges species toward the electrode. This electrode is made of, or coated with, a desired conductive material. Typically this conductive material is silicon, but other materials can be used (such as germanium) for specific applications.

FIGS. 11 and 12 are schematic diagrams of parallel plate CCP processing systems. An upper electrode 170 is positioned opposite of where substrate 150 is positioned. The upper electrode 170 can include an electrode plate 171, which can be removable. Substrate 150 is positioned on lower electrode 172, or a holder immediately above lower electrode 172. Not shown is a process gas delivery system. Process gas can be flow into the processing chamber through a shower head electrode and/or from side chamber inlets. CCP processing chambers are already known and so not all features and components of such systems are described herein.

There are two basic electrical configurations of a CCP processing chamber. In each configuration there is a source radio frequency (RF) power that creates and maintains plasma from process gasses, and there is also a bias RF power that can be optionally applied to anisotropically draw plasma species towards a substrate being processed. A common source RF power can be applied at 60 MHz or higher (even very high frequencies (VHF)), while a common bias frequency is 13 MHz or 2 Mhz, though other frequencies can be used for particular applications. In one configuration, shown in FIG. 11, a source power 175 and bias power 176 are decoupled in that source RF power 175 is applied to upper electrode 170, while bias power 176 is applied to a lower electrode 172 (substrate containing electrode). In FIG. 12, both source RF power 175 (high frequency) and bias RF power 176 (low frequency) are applied to the lower electrode 172. In either configuration, a negative direct current voltage 181 can be applied to the upper electrode 170 and can be considered as superimposed DC voltage to a CCP system that already has a source power and possibly a bias power. Thus, this technique can be described as direct current superposition (DCS).

By way of a non-limiting example, DC voltage applied can be around 1 kilovolt (kV), with current around 2.5 milliamps per centimeter squared. When negative DC voltage is applied to the upper electrode, the upper electrode attracts positive ions within plasma that exists between the parallel plate electrodes. The positive ions that are accelerated toward the upper electrode plate 171 have sufficient energy that upon striking the upper electrode plate 171, the positive ions produce secondary electrons as well as sputtering some of the silicon. The secondary electrons produced then get accelerated by (away from) the negative DC voltage, receiving sufficient energy to travel entirely through the plasma and strike the substrate 105 below. Having around 1 keV of energy (or more), these electrons can easily pass through the plasma and wafer sheath. These electrons can be referred to as ballistic electrons. These electrons can strike the substrate with sufficient energy to pass through (into) substrate layers that are several hundred nanometers thick.

In embodiments in which electrode plate 171 is made of silicon, the silicon atoms that have been sputtered from the upper electrode can be deposited on the wafer below. The top electrode 171 should be selected from a conducting material to enable creating a beam of ballistic electrons. Any number of process gasses can be used for creating plasma for this DCS treatment of a substrate. For example, Nitrogen and Argon ions have sufficient energy to easily sputter a silicon electrode. In many applications, a noble gas can be used alone or in combination with other gasses. For example a mixture of Argon and hydrogen or nitrogen can be used. For curing applications, a mixture of argon and nitrogen can produce beneficial results.

Note that because this technique consumes an upper electrode, the upper electrode needs to be replaced after a specific amount of use or degree of depletion. Accordingly, using an electrode plate can facilitate this maintenance. Note that other conductive materials (typically metals) can be used as the upper electrode, but atoms from whichever conductive material is selected will most likely sputter and be deposited on a substrate below. In the semiconductor industry, many metals deposited on a wafer can have a negative effect on device fabrication or become corroded, but silicon deposition is generally a non-harmful material in conventional processes. Germanium and other materials can also be used.

The electron flux (ballistic electrons or e-beam) can produce dangling bonds of various resist chemical groups, which can enable cross-linking of the resist, thereby changing the resist's physical properties. An oxide layer can be formed from the DCS treatment. Initially, a layer of pure silicon develops on the substrate surface because of silicon sputtering, but as soon as the substrate leaves the etch processing chamber into an oxygen environment (out of the vacuum chamber), the pure silicon layer will immediately or quickly oxidize and form a silicon oxide layer. The silicon oxide layer can then also act as a protective layer. This negative polarity DC coupling results in sputtering of the top electrode. The amount of sputtering can be controlled, however, to result in a specific thickness of silicon deposited on the substrate (12 nm, 6 nm, 2 nm, etc.), such as a thickness sufficient to help protect an underlying resist layer.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to the object being processed in accordance with the invention. The substrate may include any material portion or structure of a device, particularly a semiconductor or other electronics device, and may, for example, be a base substrate structure, such as a semiconductor wafer, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of curing a layer of material on a substrate, the method comprising:
    receiving a substrate having a patterned photoresist layer, the patterned photoresist layer created from a negative tone developer photoresist;
    positioning the substrate in a processing chamber of a capacitively coupled plasma system;
    treating the patterned photoresist layer with a flux of electrons by coupling negative polarity direct current power to a top electrode of the plasma processing system, the flux of electrons being accelerated from the top electrode with sufficient energy to pass through a plasma and strike the substrate such that the patterned photoresist layer changes in physical properties, wherein the patterned photoresist layer changing in physical properties includes increasing a value of a glass-liquid transition temperature of the negative tone developer photoresist as compared to prior to being treated with the flux of electrons, wherein the glass-liquid transition temperature of the negative tone developer photoresist is increased above 210 degrees Celsius;
    dispensing a block copolymer film on the patterned photoresist layer; and
    activating phase-separation of the block copolymer film to form different polymer features, wherein activating phase separation includes heating the substrate to a temperature sufficient to cause copolymers to segregate resulting in the different polymer features self-assembling within the patterned photoresist layer.

2. The method of claim 1, wherein the plasma is created from a process gas flowed into the processing chamber.

3. The method of claim 2, wherein the process gas comprises hydrogen gas and an inert gas.

4. The method of claim 2, wherein the process gas comprises nitrogen gas and an inert gas.

5. The method of claim 1, wherein the patterned photoresist layer defines multiple holes.

6. The method of claim 5, wherein the defined holes have a critical dimension selected that enables a specified number of divisions from a predetermined block copolymer material.

7. The method of claim 5, wherein the defined holes have a critical dimension selected that enables a specified number of phase separation divisions from a predetermined block copolymer material using a graphoepitaxy directed self-assembly operation.

8. The method of claim 1, wherein the patterned photoresist layer defines multiple trenches.

9. The method of claim 1, further comprising transferring at least a portion of the self-assembled pattern into an underlying layer.

10. The method of claim 1, further comprising:
    annealing the block copolymer film via a heat treatment that activates self-assembly of the block copolymer film such that the block copolymer film separates into a first polymer and a second polymer; and
    selectively removing the second polymer such that the first polymer defines a second pattern.

11. The method of claim 10, further comprising transferring the second pattern to an underlying layer via an etch process.

12. The method of claim 1, wherein the capacitively coupled plasma system includes a parallel plate configuration of two electrode plates facing each other.

* * * * *